US012684768B2

(12) United States Patent
Chen et al.

(10) Patent No.: US 12,684,768 B2
(45) Date of Patent: Jul. 14, 2026

(54) FLASH MEMORY WITH IMPROVED GATE STRUCTURE AND A METHOD OF CREATING THE SAME

(71) Applicant: Taiwan Semiconductor Manufacturing Co., Ltd., Hsinchu (TW)

(72) Inventors: Sheng-Chieh Chen, Hsinchu (TW); Ming Chyi Liu, Hsinchu (TW); Shih-Chang Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 583 days.

(21) Appl. No.: 17/499,364

(22) Filed: Oct. 12, 2021

(65) Prior Publication Data

US 2022/0028985 A1 Jan. 27, 2022

Related U.S. Application Data

(62) Division of application No. 16/359,027, filed on Mar. 20, 2019, now Pat. No. 11,217,596.

(Continued)

(51) Int. Cl.
H10B 43/00 (2023.01)
H10B 41/00 (2023.01)
(Continued)

(52) U.S. Cl.
CPC ............. H10B 43/00 (2023.02); H10B 41/00 (2023.02); H10B 43/30 (2023.02); H10D 30/0413 (2025.01); H10D 30/611 (2025.01);

*H10D 30/69* (2025.01); *H10D 30/696* (2025.01); *H10D 64/037* (2025.01);
(Continued)

(58) Field of Classification Search
CPC .............. H10B 43/30; H01L 29/40117; H01L 29/42344; H01L 29/66833; H01L 29/7831; H01L 29/792; H01L 21/823443; H01L 21/823456; H01L 21/823462; H01L 21/823468; H10D 64/037; H10D 30/0413; H10D 30/611; H10D 30/69; H10D 30/696;
(Continued)

(56) References Cited

U.S. PATENT DOCUMENTS 6,074,914 A    6/2000  Ogura
7,196,372 B1   3/2007  Yu et al.
(Continued)

FOREIGN PATENT DOCUMENTS

CN        104517903 A     4/2015
CN        104517904 A     4/2015
(Continued)

*Primary Examiner* — Marcos D. Pizarro
(74) *Attorney, Agent, or Firm* — Seed Intellectual Property Law Group LLP

(57) ABSTRACT

Various embodiments provide a flash memory with an improved gate structure and a method of creating the same. The flash memory includes a plurality of memory cells that include a memory gate, a selection gate, a gate dielectric layer, and a protective cap formed on an upper surface of the gate dielectric layer. The protective cap protects the gate dielectric layer, and prevents the memory and selection gates from being unintentionally electrically connected to each other by conductive material.

20 Claims, 8 Drawing Sheets

Related U.S. Application Data

(60) Provisional application No. 62/733,860, filed on Sep. 20, 2018.

(51) Int. Cl.

| | |
|---|---|
| *H10B 43/30* | (2023.01) |
| *H10D 30/01* | (2025.01) |
| *H10D 30/60* | (2025.01) |
| *H10D 30/69* | (2025.01) |
| *H10D 64/01* | (2025.01) |
| *H10D 84/01* | (2026.01) |
| *H10D 84/03* | (2025.01) |

(52) U.S. Cl.

CPC ..... *H10D 84/0137* (2025.01); *H10D 84/0142* (2025.01); *H10D 84/0144* (2025.01); *H10D 84/0147* (2025.01); *H10D 84/038* (2025.01)

(58) Field of Classification Search

CPC ........... H10D 84/0137; H10D 84/0142; H10D 84/0144; H10D 84/0147; H10D 84/038

See application file for complete search history.

(56) References Cited

U.S. PATENT DOCUMENTS

| | | | |
|---|---|---|---|
| 8,530,950 B1 | 9/2013 | Kang et al. | |
| 9,450,057 B2 | 9/2016 | Wu et al. | |
| 9,484,351 B2 | 11/2016 | Wu et al. | |
| 9,735,245 B2 | 8/2017 | Chuang et al. | |
| 9,960,176 B2 | 5/2018 | Wu et al. | |
| 9,978,603 B2 | 5/2018 | Wu et al. | |
| 9,978,759 B2 | 5/2018 | Wu et al. | |
| 2006/0226466 A1 | 10/2006 | Schuler et al. | |
| 2009/0050955 A1 | 2/2009 | Akita et al. | |
| 2009/0057906 A1 | 3/2009 | Buchoff et al. | |
| 2011/0095348 A1 | 4/2011 | Chakihara et al. | |
| 2012/0299084 A1 | 11/2012 | Saito et al. | |
| 2013/0240977 A1* | 9/2013 | Kaneoka | H01L 29/40114 |
| | | | 438/287 |
| 2014/0170843 A1 | 6/2014 | Chen et al. | |
| 2014/0179076 A1 | 6/2014 | Shinohara | |
| 2015/0091071 A1 | 4/2015 | Wu et al. | |
| 2015/0364558 A1 | 12/2015 | Wu et al. | |
| 2016/0293620 A1* | 10/2016 | Ogata | H01L 21/0214 |
| 2017/0170188 A1 | 6/2017 | Wu et al. | |
| 2017/0373083 A1 | 12/2017 | Shukuri | |

FOREIGN PATENT DOCUMENTS

| | | |
|---|---|---|
| CN | 104851886 A | 8/2015 |
| CN | 106684088 A | 5/2017 |
| CN | 106876402 A | 6/2017 |
| KR | 10-2015-0035451 A | 4/2015 |
| KR | 10-2015-0097374 A | 8/2015 |
| KR | 10-1670557 B1 | 10/2016 |

* cited by examiner

FLASH MEMORY WITH IMPROVED GATE STRUCTURE AND A METHOD OF CREATING THE SAME

BACKGROUND

Flash memories are non-volatile computer storage mediums that may be reprogrammed and erased electronically. Flash memories typically include an array of memory cells that stores electrical charges representing bits of data.

Flash memories have many advantages over other types of memories. For example, metal-oxide nitride oxide silicon (MONOS) flash memories provide high speed programming and erasing, have excellent endurance and retention, utilize a relatively small area, and have a high density. As such, flash memories are used for a variety of applications, such as automobile applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
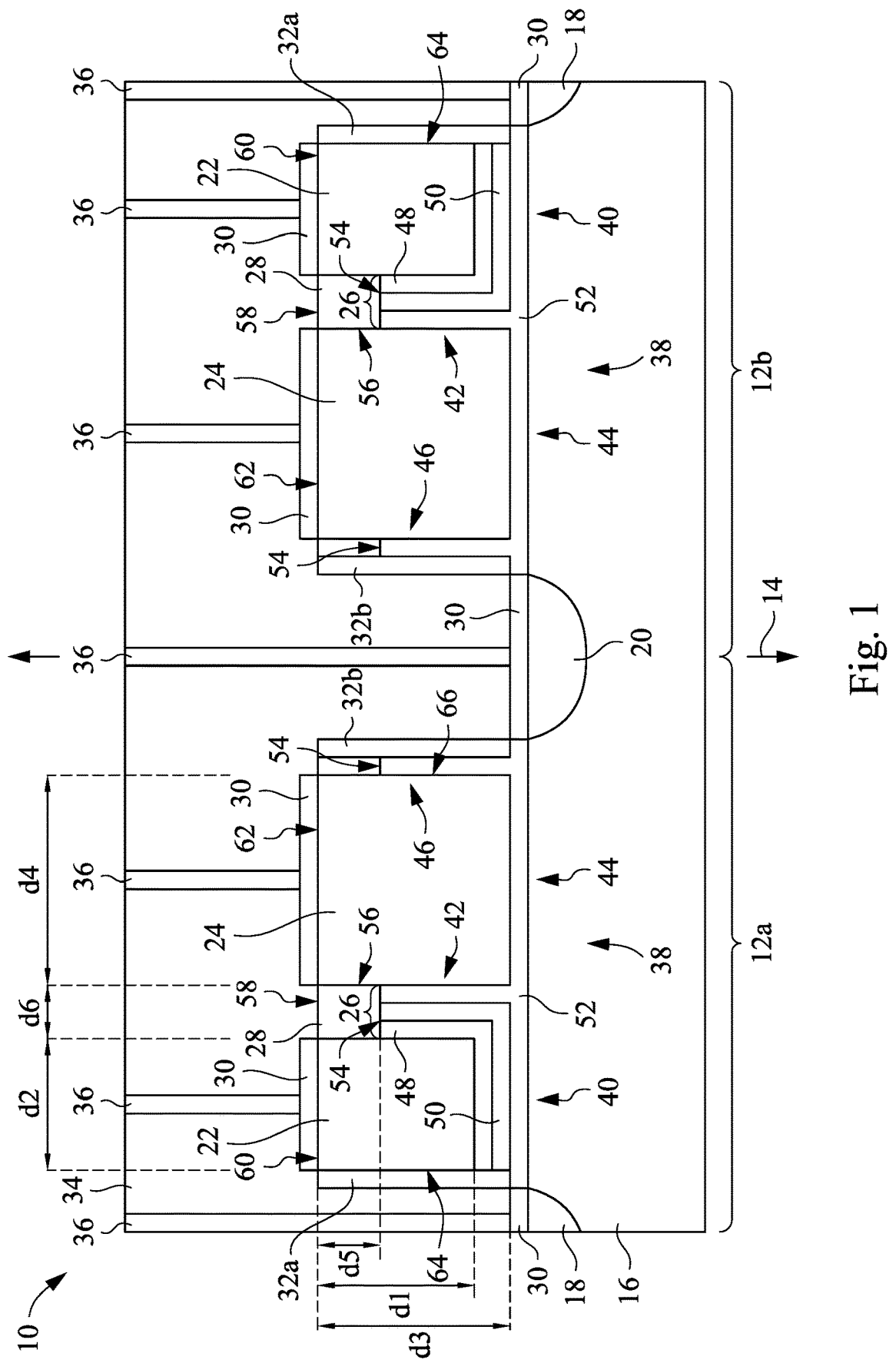
FIG. 1 is a cross-sectional view of a memory in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As previously discussed, flash memories have many advantages over other types of memories, and are used for a variety of applications. However, it is generally difficult to integrate a flash memory into standard logic device fabrication processes as the flash memory will often become damaged during subsequent fabrication process. For example, a flash memory with split gate memory cells typically includes a dielectric layer formed between its gates. The dielectric layer may become damaged during fabrication, and the gates may unintentionally become electrically coupled to each other. Consequently, the flash memory may suffer from current leakage between the gates, and cease to function properly.

As one example, a metal-oxide nitride oxide silicon (MONOS) flash memory will often become damaged from subsequent standard logic device fabrication processes. Namely, a subsequent implantation process will frequently damage the dielectric layer between the memory gate and the selection gate of the MONOS flash memory. Consequently, the MONOS flash memory will often suffer from voltage leakage between the memory and selection gates. As another example, during fabrication of the MONOS flash memory, the dielectric layer between the memory gate and the selection gate will often have a concaved upper surface. Stated differently, a cavity will frequently be formed in the dielectric layer and between the memory and selection gates. As a result, conductive material may inadvertently be formed in the cavity during, for example, subsequent silicide processes. Consequently, the memory and selection gates may unintentionally become electrically coupled to each other by the conductive material, and the flash memory will cease to function properly.

The present disclosure is directed to a flash memory with an improved gate structure and a method of creating the same. The improved gate structure reduces or prevents current leakage between the gates of the flash memory.

FIG. 1 is a cross-sectional view of a memory 10 in accordance with some embodiments. In one embodiment, the memory 10 is a flash memory. In one embodiment, the memory 10 is a metal-oxide nitride oxide silicon (MONOS) flash memory.

The memory 10 includes a plurality of memory cells. In one embodiment, as shown in FIG. 1, the memory 10 includes a plurality of pairs of memory cells. A pair of memory cells includes a first memory cell 12a and a second memory cell 12b. Although a single pair of memory cells is shown in FIG. 1, the memory 10 may include any number of memory cells.

In one embodiment, the first and second memory cells 12a, 12b are split gate memory cells. In one embodiment, as shown in FIG. 1, the first and second memory cells 12a, 12b are symmetrical to each other along an axis 14.

The first and second memory cells 12a, 12b are on a substrate 16. Each of the first and second memory cells 12a, 12b includes a source region 18, a drain region 20, a memory gate 22, a selection gate 24, a gate dielectric layer 26, a protective cap 28, contact layers 30, and spacers 32a, 32b. An interlayer dielectric (ILD) 34 and conductive vias 36 are positioned over the first and second memory cells 12a, 12b.

The substrate 16 provides a support for the first and second memory cells 12a, 12b. In one embodiment, the substrate 16 is a p-type silicon substrate with, for example, an impurity concentration in a range of about $1 \times 10^{15}$ cm$^{-3}$ to about $2 \times 10^{15}$ cm$^{-3}$. In one embodiment, the substrate 16 is an n-type silicon substrate with, for example, an impurity concentration in a range of about $1 \times 10^{15}$ cm$^{-3}$ to about $2 \times 10^{15}$ cm$^{3}$. Alternatively, the substrate 16 may include another elementary semiconductor, such as germanium; a compound semiconductor including Group Iv-Iv compound semiconductors such as SiC and SiGe, Group III-v compound semiconductors such as GaAs, GaP, GaN, InP, InAs, InSb, GaAsP, AlGaN, AllnAs, AlGaAs, GaInAs, GaInP, and/or GaInAsP; or combinations thereof. In one embodiment, the substrate 16 is a silicon layer of an SOI (silicon-on insulator) substrate. The substrate 16 may include various regions that have been suitably doped with impurities (e.g., p-type or n-type conductivity).

In one embodiment, other various electrical components are fabricated on or in the substrate 16. For example, transistors, resistors, capacitors, etc., may be fabricated in the substrate 16 along with the memory 10.

The source region 18 and the drain region 20 are positioned within the substrate 16. In one embodiment, as shown in FIG. 1, the drain region 20 is a common drain and is shared by both the first and second memory cells 12a, 12b. In one embodiment, the first and second memory cells 12a, 12b each include their own drain region.

It is noted that the positions of the source region 18 and the drain region 20 may be interchanged with each other. For example, in one embodiment, the memory gates 22 and the selection gates 24 of the first and second memory cells 12a, 12b are positioned between two drain regions; and a source region is positioned between the selection gates 24 of the first and second memory cells 12a, 12b.

The memory gates 22 and the selection gates 24 are positioned on the substrate 16. The memory gate 22 and the selection gate 24 directly overlie a channel region 38 that extends between the source region 18 and the drain region 20.

In one embodiment, the memory gates 22 and the selection gates 24 are made of conductive material. For example, in one embodiment, the memory gates 22 and the selection gates 24 are made of a doped polysilicon, metal such as Hf, Zr, Ti, Ta, TiN TaN, TaC, Co, Ru, Al, Cu, and/or W, combinations thereof, or multi-layers thereof.

In one embodiment, as shown in FIG. 1, the cross-sections of the memory gate 22 and the selection gate 24 each have a rectangular shape. However, other shapes are possible.

In one embodiment, as shown in FIG. 1, the cross-section of the selection gate 24 is larger than the cross-section of the memory gate 22. More specifically, in one embodiment, the memory gate 22 has a first dimension d1 and a second dimension d2, and the selection gate 24 has a third dimension d3 that is greater than the first dimension d1 and a fourth dimension d4 that is greater than the second dimension d2.

In one embodiment, the first dimension d1 is between 650 and 750 angstroms. In one embodiment, the second dimension d2 is between 400 and 500 angstroms. In one embodiment, the third dimension d3 is between 700 and 800 angstroms. In one embodiment, the fourth dimension d4 is between 750 and 850 angstroms. It is noted that the dimensions d1, d2, d3, d4 are not limited to the foregoing and in other embodiments may be smaller or greater than the examples given above. For example, the memory 10 may be scaled down such that the first dimension d1 is between 550 and 650 angstroms, the second dimension d2 is between 300 and 400 angstroms, the third dimension d3 is between 600 and 700 angstroms, and/or the fourth dimension d4 is between 650 and 750 angstroms. Alternatively, the memory 10 may be scaled up such that the first dimension d1 is between 750 and 850 angstroms, the second dimension d2 is between 500 and 600 angstroms, the third dimension d3 is between 800 and 900 angstroms, and/or the fourth dimension d4 is between 850 and 950 angstroms.

The gate dielectric layer 26 is positioned between the memory gate 22 and the selection gate 24. The gate dielectric layer 26 electrically isolates the memory gate 22 and the selection gate 24 from each other, and isolates the memory gate 22 and the selection gate 24 from the substrate 16. The memory gate 22 and the selection gate 24 are often referred to as floating gates. As will be discussed in further detail below, the gate dielectric layer 26 functions as a charge trapping layer.

The gate dielectric layer 26 extends between the memory gate 22 and the selection gate 24, between the substrate 16 and the memory gate 22, and between the substrate 16 and the selection gate 24. Namely, the gate dielectric layer 26 includes a first portion 40, a second portion 42, a third portion 44, and a fourth portion 46. As shown in FIG. 1, the first portion 40 is positioned between the memory gate 22 and the substrate 16; the second portion 42 is positioned between the memory gate 22 and the selection gate 24, the third portion 44 is positioned between the selection gate 24 and the substrate 16; and the fourth portion 46 is positioned on a side of the selection gate 24 opposite to the second portion 42.

The gate dielectric layer 26 may be made of a variety of different dielectric materials. For example, the gate dielectric layer 26 may include nitride; silicon oxide; a high dielectric constant (high-K) dielectric material selected from one or more of hafnium oxide ($HfO_2$), hafnium silicon oxide (HfSiO), hafnium silicon oxynitride (HfSiON), hafnium tantalum oxide (HfTaO), hafnium titanium oxide (HfTiO), and/or hafnium zirconium oxide (HfZrO); combinations thereof; and/or other suitable materials.

In one embodiment, the gate dielectric layer 26 is a multilayer dielectric. Stated differently, in one embodiment, the gate dielectric layer 26 includes a plurality of sub-layers. For example, as shown in FIG. 1, the gate dielectric layer 26 includes a first layer 48, a second layer 50, and a third layer 52.

In one embodiment, as shown in FIG. 1, the first and second portions 40, 42 of the gate dielectric layer 26 includes the first, second, and third layers 48, 50, 52; and the third and fourth portions 44, 46 of the gate dielectric layer 26 do not include the first and second layer 48, 50 and includes the third layer 52. It is noted that the gate dielectric layer 26 may be a single dielectric layer in some embodiments.

In one embodiment, the gate dielectric layer 26 is an oxide-nitride-oxide (ONO) layer. In this embodiment, the first layer 48 is made of oxide, the second layer 50 is made of nitride, and the third layer 52 is made of oxide. It is noted that embodiments of the present disclosure are not limited to foregoing materials, i.e., the gate dielectric layer 26 can be made of materials different from oxide-nitride-oxide. For example, the gate dielectric layer 26 may include multiple layers of silicon oxide; a high dielectric constant (high-K) dielectric material selected from one or more of hafnium oxide ($HfO_2$), hafnium silicon oxide (HfSiO), hafnium silicon oxynitride (HfSiON), hafnium tantalum oxide (HfTaO), hafnium titanium oxide (HfTiO), and hafnium zirconium oxide (HfZrO); and/or other suitable materials.

The protective cap 28 is positioned on an upper surface 54 of the gate dielectric layer 26. Stated differently, the protective cap 28 fills a cavity 56 that is formed by the memory gate 22, the selection gate 24, and the gate dielectric layer 26.

In one embodiment, the protective cap 28 includes an upper surface 58 that is substantially at a same level, e.g., coplanar with, an upper surface 60 of the memory gate 22 and an upper surface 62 of the selection gate 24.

As will be discussed in further detail below, the protective cap 28 protects the gate dielectric layer 26 during fabrication. Namely, as the protective cap 28 covers the upper surface 54 of the gate dielectric layer 26, the gate dielectric layer 26 is not left exposed during fabrication and is protected from being damaged by subsequent fabrication processes.

In addition, because the protective cap 28 fills the cavity 56, the protective cap 28 prevents conductive material (e.g., conductive material used to form the contact layers 30) from possibly filling the cavity 56 and electrically coupling the memory gate 22 and the selection gate 24 together.

In one embodiment, the protective cap 28 is made of a dielectric material. In one embodiment, the protective cap 28 is made of nitride. It is noted that embodiments of the present disclosure are not limited to a protective cap 28 formed of nitride, i.e., the protective cap 28 can be made of materials other than nitride. For example, the protective cap 28 may include silicon oxide; a high dielectric constant (high-K) dielectric material selected from one or more of hafnium oxide ($HfO_2$), hafnium silicon oxide (HfSiO), hafnium silicon oxynitride (HfSiON), hafnium tantalum oxide (HfTaO), hafnium titanium oxide (HMO), and hafnium zirconium oxide (HfZrO); combinations thereof; and/or other suitable materials.

As previously discussed with respect to FIG. 1, in one embodiment, the gate dielectric layer 26 is a multilayer dielectric including a first layer 48, a second layer 50, and a third layer 52. In one embodiment, the protective cap 28 is made of the same material as at least one of the first layer 48, the second layer 50, and the third layer 52. For example, in one embodiment, the protective cap 28 is made of the same material as the second layer 50. In other embodiments, the protective cap 28 is made of a material different from the material making up the first layer 48, the second layer 50, and/or the third layer 52.

It is noted that the gate dielectric layer 26 may be a single dielectric layer in some embodiments. In these embodiments, the protective cap 28 may be made of a material that is the same or different from the material of the gate dielectric layer 26.

In one embodiment, as shown in FIG. 1, the protective cap 28 has a fifth dimension d5 and a sixth dimension d6. In one embodiment, the fifth dimension d5 is between 100 and 200 angstrom. In one embodiment, the sixth dimension d6 is between 100 and 200 angstrom. In one embodiment, a ratio between the fifth dimension d5 and the sixth dimension d6 is between 1:1 and 3:1. It is noted that the fifth and sixth dimensions d5, d6 are not limited to the foregoing and in other embodiments may be smaller or greater than the examples given above. For example, the memory 10 may be scaled down such that the fifth dimension d5 is between 50 and 150 angstroms, and the sixth dimension d6 is between 50 and 150. Alternatively, the memory 10 may be scaled up such that the fifth dimension d5 is between 150 and 250 angstroms, and the sixth dimension d6 is between 150 and 250.

The contact layers 30 are formed on the source region 18, the drain region 20, the memory gate 22, and the selection gate 24. In one embodiment, the contact layers 30 are made of a conductive material. For example, in one embodiment, the contact layers 30 are made of nickel silicide. The contact layers 30 are used to reduce contact resistance between wiring layers (e.g., the conductive vias 36) and the source region 18, the drain region 20, the memory gate 22, and the selection gate 24.

The spacers 32a, 32b on the substrate 16 are positioned laterally to the memory gate 22 and the selection gate 24. The spacers 32a, 32b protect sidewalls of the memory gate 22 and the selection gate 24. Namely, the spacer 32a protects a sidewall 64 of the memory gate 22, and the spacer 32b protects a sidewall 66 of the selection gate 24.

In one embodiment, the spacers 32a, 32b are separated from the substrate 16 by the gate dielectric layer 26. For example, as shown in FIG. 1, the spacers 32a, 32b are separated from the substrate 16 by the third layer 52 of the gate dielectric layer 26.

In one embodiment, the spacers 32a, 32b are made of a dielectric material. For example, the spacers 32a, 32b may be made of nitride, a low K dielectric material such as silicon oxynitride ($SiO_xN_y$), silicon nitride ($Si_3N_4$), silicon monoxide (SiO), silicon oxynitrocarbide (SiONC), and silicon oxycarbide (SiOC); combinations thereof; and/or other suitable materials.

The ILD 34 and the conductive vias 36 form an interconnect layer, sometimes referred to as a metal layer. The ILD 34 is formed over the first and second memory cells 12a, 12b, and electrically isolates the conductive vias 36 from each other.

The conductive vias 36 extend through the ILD 34, and physically contact the contact layers 30. The conductive vias 36 electrically couple the source region 18, the drain region 20, the memory gate 22, and the selection gate 24 to other various electrical components (e.g., contact pads, transistors, capacitors, resistors, processors, etc.) and/or other interconnection layers. Although a single interconnect layer is shown in FIG. 1, the memory 10 may include any number of interconnect layers.

During operation of the memory 10, the first and second memory cells 12a, 12b stores electrical charges that represent data bits. An electrical charge is stored in or released from the first and second memory cells 12a, 12b by biasing the memory gates 22 and the selection gates 24. For example, during a program operation, the first memory cell 12a is set to store an electrical charge by biasing its memory gate 22 and selection gate 24 so that electrons travel towards the memory gate 22 and become trapped within the gate dielectric layer 26. As the gate dielectric layer 26 stores the electrical charge, the gate dielectric layer 26 is sometimes referred to as a charge trapping layer. Conversely, during an erase operation, the first memory cell 12a is set to release an electrical charge by biasing its memory gate 22 and selection gate 24 so that electrons travel away from the memory gate 22 and become removed from the gate dielectric layer 26.

FIGS. 2 to 8 are cross-sectional views illustrating a method of fabricating a flash memory in accordance with some embodiments.

Figure 2:
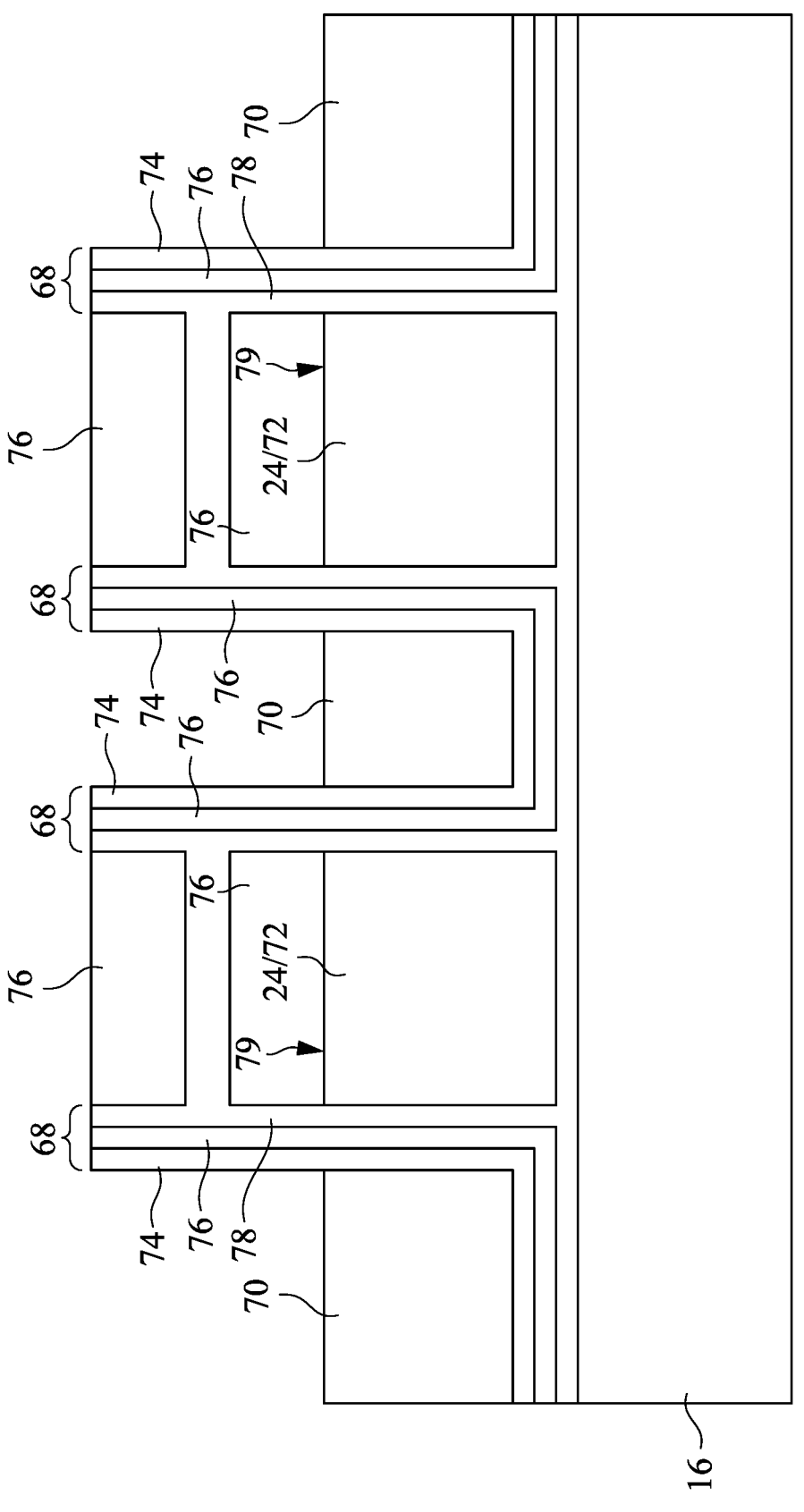
FIGS. 2 to 8 are cross-sectional views illustrating a method of fabricating a flash memory in accordance with some embodiments.

In FIG. 2, a dielectric layer 68, a first conductive layer 70, and a second conductive layer 72 are formed on the substrate 16. The second conductive layer 72 forms the selection gate 24.

As will become evident with discussion below, the dielectric layer 68 is used to create the gate dielectric layers 26 for the first and second memory cells 12a, 12b; and the first conductive layer 70 is used to create the memory gates 22 for the first and second memory cells 12a, 12b.

The dielectric layer 68, the first conductive layer 70, and the second conductive layer 72 may be formed using various semiconductor processing techniques. For example, the dielectric layer 68, the first conductive layer 70, and the second conductive layer 72 may be formed using a sputtering process, a chemical vapor deposition process, or an ion metal plasma (IMP) process, and then patterned using masking and etching techniques. In one embodiment, as shown in FIG. 2, a portion of the dielectric layer 68 (e.g., a layer 78, which will be discussed in further detail below) is first formed on the substrate 16, and then the second conductive layer 72 is formed on the portion of the dielectric layer 68. Subsequently, the remaining portions of the dielectric layer 68 are formed, and then the first conductive layer 70 is formed on the dielectric layer 68. In another embodiment, the second conductive layer 72 is formed directly on the substrate 16. In this embodiment, the second conductive layer 72 is first formed on the substrate 16, and then the dielectric layer 68 is formed on the substrate 16 and over the second conductive layer 72. Subsequently, the first conductive layer 70 is formed on the dielectric layer 68.

As previously discussed with respect to FIG. 1, in one embodiment, the gate dielectric layer 26 is a multilayer dielectric that includes a first layer 48, a second layer 50, and a third layer 52. In this embodiment, the dielectric layer 68 includes a first layer 74, a second layer 76, and a third layer 78. The first layer 74, the second layer 76, and the third layer 78 are used to create the first layer 48, the second layer 50, and the third layer 52, respectively, of FIG. 1. It is noted that portions of the first layer 74, the second layer 76, and the third layer 78 are formed over and on an upper surface 79 of the second conductive layer 72 as a byproduct of fabricating the multiple layers of the gate dielectric layer 26. For example, as shown in FIG. 2, a stack of a first portion of the second layer 76, a portion of the third layer 78, and a second portion of the second layer 76 are formed on the upper surface 79 of the second conductive layer 72. As will be discussed in further detail with respect to FIG. 7, the portions of the dielectric layer 68 that are on the upper surface 79 of the second conductive layer 72 will be removed in a subsequent process.

As previously discussed with respect to FIG. 1, in one embodiment, the gate dielectric layer 26 is an oxide-nitride-oxide (ONO) layer. In this embodiment, the first layer 74 of the dielectric layer 68 is made of oxide, the second layer 76 of the dielectric layer 68 is made of nitride, and the third layer 78 of the dielectric layer 68 is made of oxide. It is noted that embodiments of the present disclosure are not limited to foregoing materials, i.e., the gate dielectric layer 26 can be made of other suitable materials as previously discussed.

In one embodiment, the first conductive layer 70, and the second conductive layer 72 are made of conductive material. For example, in one embodiment, the first conductive layer 70 and the second conductive layer 72 are made of a doped polysilicon, metal such as Hf, Zr, Ti, Ta, TiN, TaN, Co, Ru, Al, Cu, and/or W, combinations thereof, or multi-layers thereof. It is noted that embodiments of the present disclosure are not limited to foregoing materials, i.e., the first conductive layer 70 and the second conductive layer 72 can be made of other suitable materials.

Figure 3:
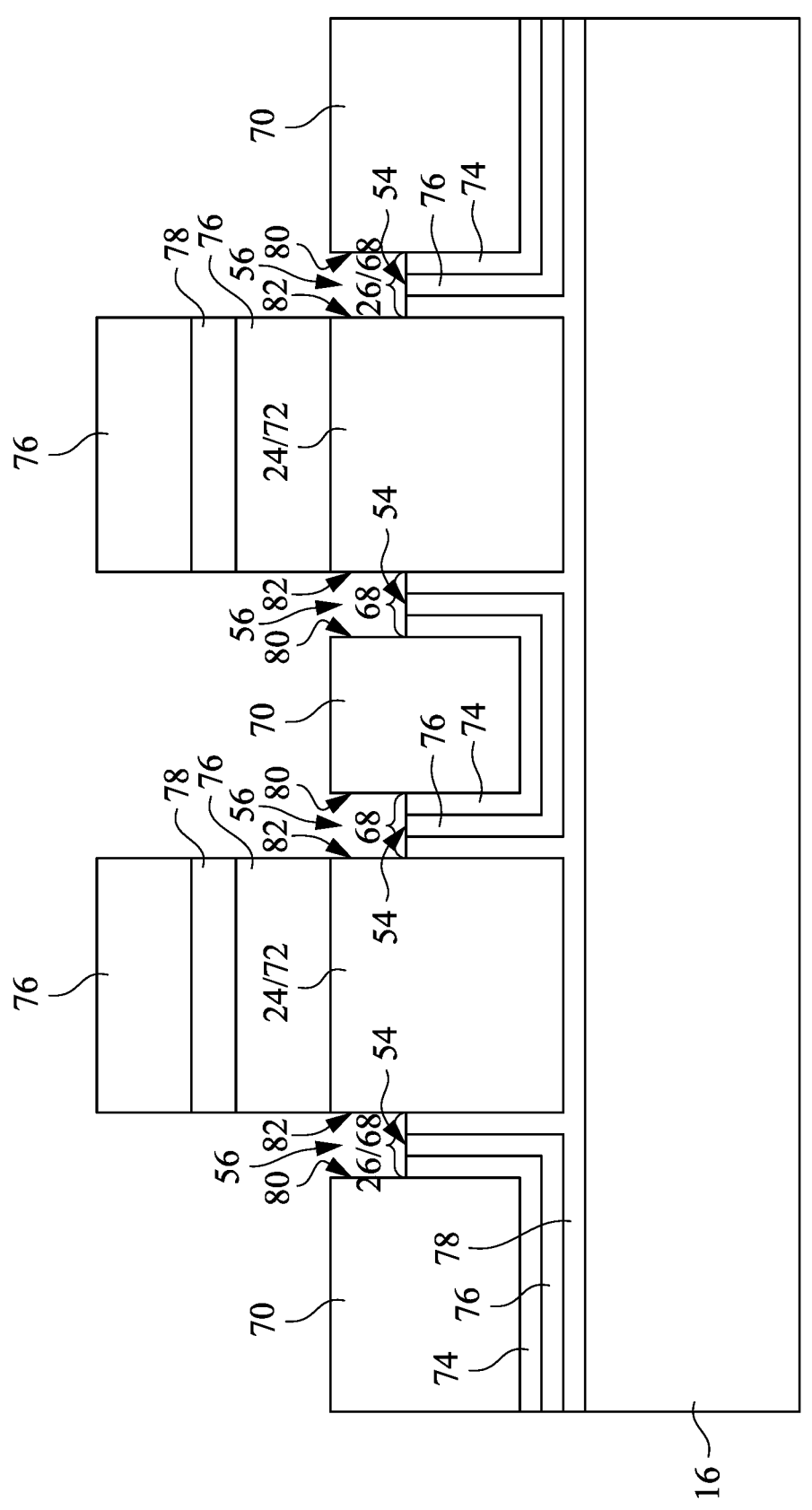

In FIG. 3, portions of the dielectric layer 68 are removed to create the gate dielectric layer 26. In one embodiment, the portions of the dielectric layer 68 are removed subsequent to the dielectric layer 68, the first conductive layer 70, and the second conductive layer 72 being formed on the substrate 16 in FIG. 2.

The portions of the dielectric layer 68 are removed to partially expose sidewalls 80 of the first conductive layer 70 and sidewalls 82 of the second conductive layer 72. In addition, the upper surface 54 of the gate dielectric layer 26 is exposed and the cavities 56 are created, which were discussed with respect to FIG. 1.

The portions of the dielectric layer 68 may be removed using various semiconductor processing techniques. For example, the portions of the dielectric layer 68 may be removed using masking and etching techniques, such as a wet etch.

Figure 4:
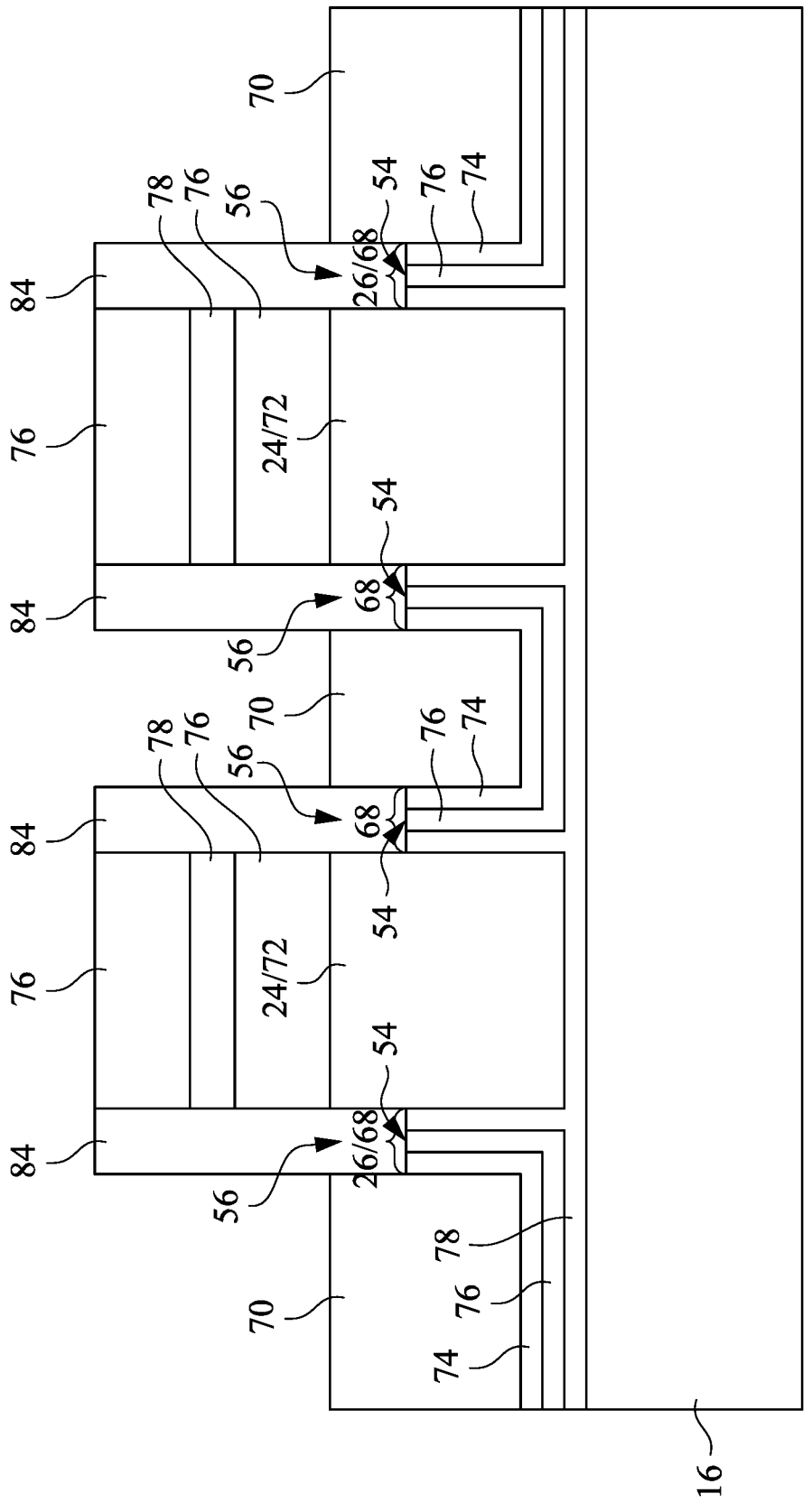

In FIG. 4, a protective layer 84 is formed on the upper surface 54 of the dielectric layer 68 and in the cavities 56. In one embodiment, the protective layer 84 is formed subsequent to the cavities 56 being formed in FIG. 3. As will become evident with the discussion below, the protective layer 84 is used to create the protective cap 28.

The protective layer 84 may be formed using various semiconductor processing techniques. For example, the protective layer 84 may be formed using a sputtering process, a chemical vapor deposition process, or an IMP process, and then patterned using masking and etching techniques.

In one embodiment, the protective layer 84 is made of a dielectric material. In one embodiment, the protective layer 84 is made of nitride. It is noted that embodiments of the present disclosure are not limited to a protective layer 84 formed of nitride, i.e., the protective layer 84 can be made of materials other than nitride. For example, the protective layer 84 may include silicon oxide; a high dielectric constant (high-K) dielectric material selected from one or more of hafnium oxide ($HfO_2$), hafnium silicon oxide (HfSiO), hafnium silicon oxynitride (HfSiON), hafnium tantalum oxide (HMO), hafnium titanium oxide (HMO), and hafnium zirconium oxide (HfZrO); combinations thereof; and/or other suitable materials.

In one embodiment, the protective layer 84 is made of the same material as the dielectric layer 68 or the same material of at least one of the materials making up dielectric layer 68 when dielectric layer 68 includes more than one material. For example, in one embodiment, the dielectric layer 68 is made of the same material as the second layer 76.

As the protective layer 84 covers the upper surface 54, the gate dielectric layer 26 is not left exposed during subsequent fabrication processes. As a result, conductive materials cannot be deposited onto the gate dielectric layer 26 and/or the gate dielectric layer 26 is protected from possible damage from subsequent fabrication processes, such as the processes that will be discussed with respect to FIGS. 5-8. Preventing deposition of conductive materials onto gate dielectric layer 26 and/or damage to the gate dielectric layer 26 ensures that the memory gate 22 and the selection gate 24 are electrically isolated from each other by the gate dielectric layer 26, and minimizes potential current leakage between the memory gate 22 and the selection gate 24.

Figure 5:
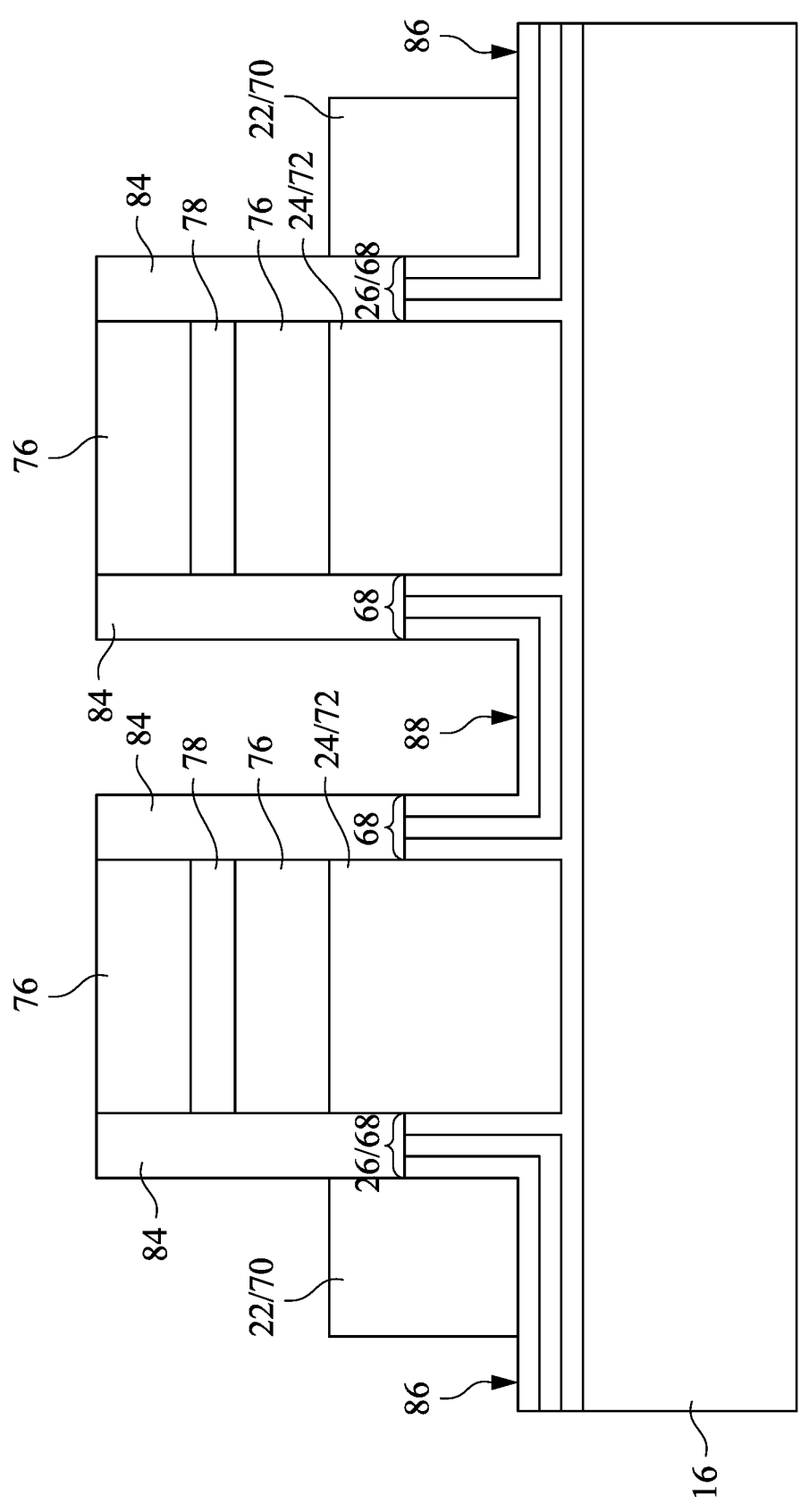

In FIG. 5, portions of the first conductive layer 70 are removed to create the memory gates 22. In one embodiment, portions of the first conductive layer 70 are removed subsequent to the protective layer 84 being formed in FIG. 4.

The portions of the first conductive layer 70 are removed to partially expose outer surfaces 86 of the dielectric layer 68 and expose an inner surface 88 of the dielectric layer 68.

The portions of the first conductive layer 70 may be removed using various semiconductor processing techniques. For example, the portions of the first conductive layer 70 may be removed using masking and etching techniques.

In one embodiment, the portions of the first conductive layer 70 are removed in two separate steps. In a first step, portions of the first conductive layer 70 that are on the outer surfaces 86 of the dielectric layer 68 are removed to form the memory gates 22. In particular, a first hard mask (e.g., a silicon nitride layer) is formed on portions of the first conductive layer 70 that are on the inner surface 88 and portions of the first conductive layer 70 that form the memory gates 22. The remaining portions of the first conductive layer 70 are left uncovered by the first hard mask. The uncovered portions of the first conductive layer 70 are then removed using, for example, a wet etch. In a second step, the portions of the first conductive layer 70 that are on the inner surface 88 are removed. Namely, a second hard mask is formed on the portions of the first conductive layer 70 that form the memory gates 22 and on the first hard mask. The portions first conductive layer 70 that are on the inner surface 88 are left uncovered by the second hard mask. The portions first conductive layer 70 that are on the inner surface 88 are then removed using, for example, a wet etch. Subsequently, the first and second hard masks are removed to obtain the first conductive layer 70 as shown in FIG. 5. It is noted that photoresist coatings may also be used instead of the first hard mask and/or the second hard mask. In addition, the first and second steps may be reversed. For example, the portions of the first conductive layer 70 that are on the inner surface 88 may be removed first, and the portions of the first conductive layer 70 that are on the outer surfaces 86 of the dielectric layer 68 may be removed second.

Figure 6:
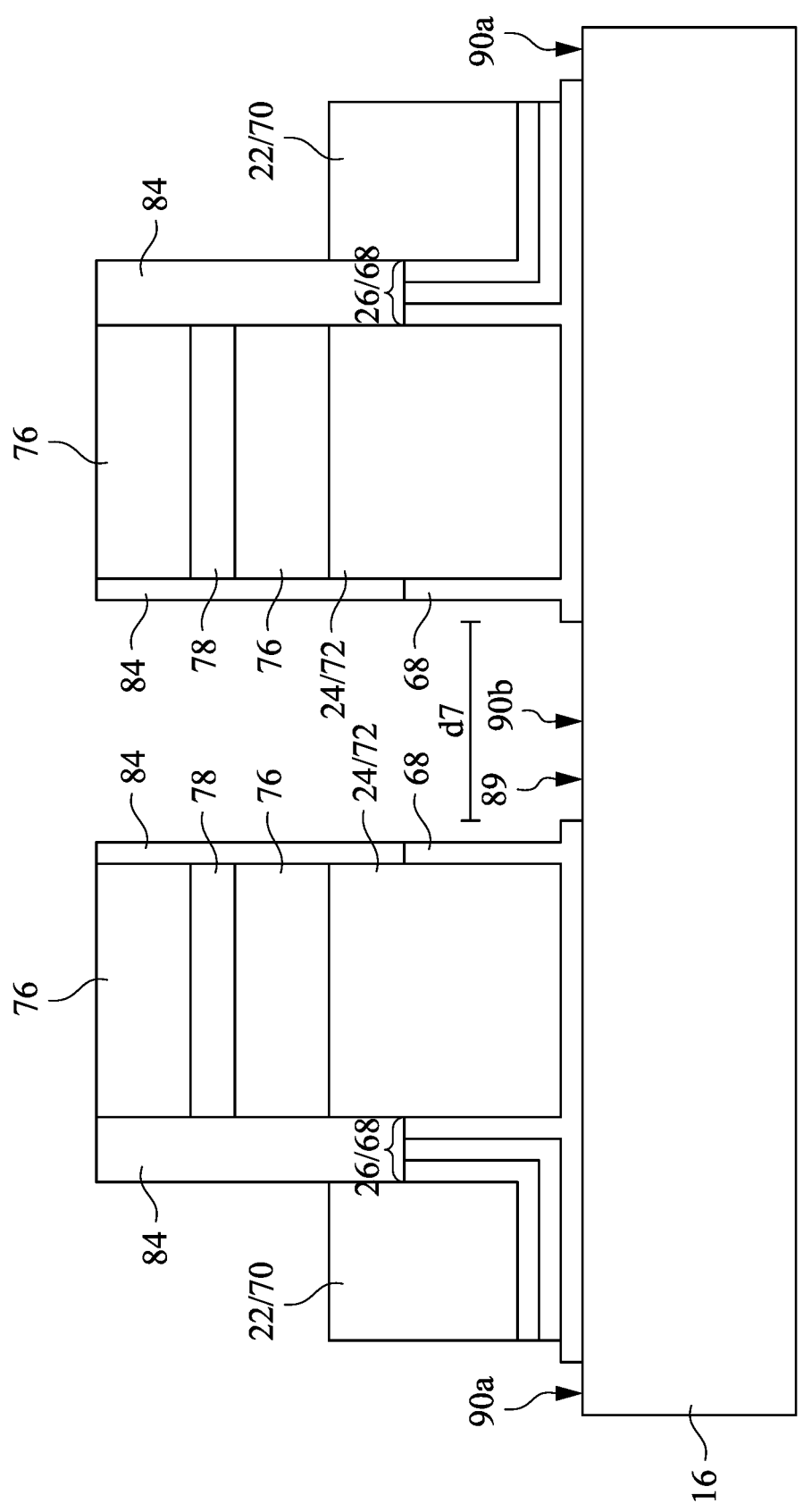

In FIG. 6, portions of the dielectric layer 68 are removed to expose portions of an upper surface 89 of the substrate 16. In one embodiment, portions of the dielectric layer 68 are removed subsequent to the portions of the first conductive layer 70 being removed in FIG. 5.

Outer portions of the dielectric layer 68 are removed to expose outer portions 90a of the upper surface 89, and an inner portion of the dielectric layer 68 is removed to expose an inner portion 90b of the upper surface 89. As will be discussed with respect to FIG. 7, portions of the upper surface 89 are exposed to form source and drain regions.

It is noted that the portions of the dielectric layer 68 may be removed in multiple steps. For example, in one embodiment, the outer portions of the dielectric layer 68 are removed to expose the outer portions 90a of the upper surface 89, and the inner portion of the dielectric layer 68 is subsequently removed to expose the inner portion 90b of the upper surface 89. Conversely, in one embodiment, the inner portion of the dielectric layer 68 is removed to expose the inner portion 90b of the upper surface 89, and the outer portions of the dielectric layer 68 are subsequently removed to expose the outer portions 90a of the upper surface 89.

As previously discussed with respect to FIG. 1, in one embodiment, the drain region 20 is a common drain and is shared by both the first and second memory cells 12a, 12b. In order to form a drain region with a sufficient size to be shared by the first and second memory cells 12a, 12b, in one embodiment, portions of the protective layer 84 are also removed. For example, as shown in FIG. 6, portions of the dielectric layer 68 and the protective layer 84 are removed such that the exposed portion of the upper surface 89 between the selection gates 24 has a seventh dimension d7.

In one embodiment, the dimension d7 is between 400 and 500 angstroms. It is noted that the seventh dimension d7 is not limited to the foregoing and in other embodiments may be smaller or greater than the example given above. For example, the memory 10 may be scaled down such that the seventh dimension d7 is between 300 and 400 angstroms. Alternatively, the memory 10 may be scaled up such that the seventh dimension d7 is between 500 and 600 angstroms.

The portions of the dielectric layer 68 and/or the protective layer 84 may be removed using various semiconductor processing techniques. For example, the portions of the dielectric layer 68 and/or the protective layer 84 may be removed using masking and etching techniques.

Figure 7:
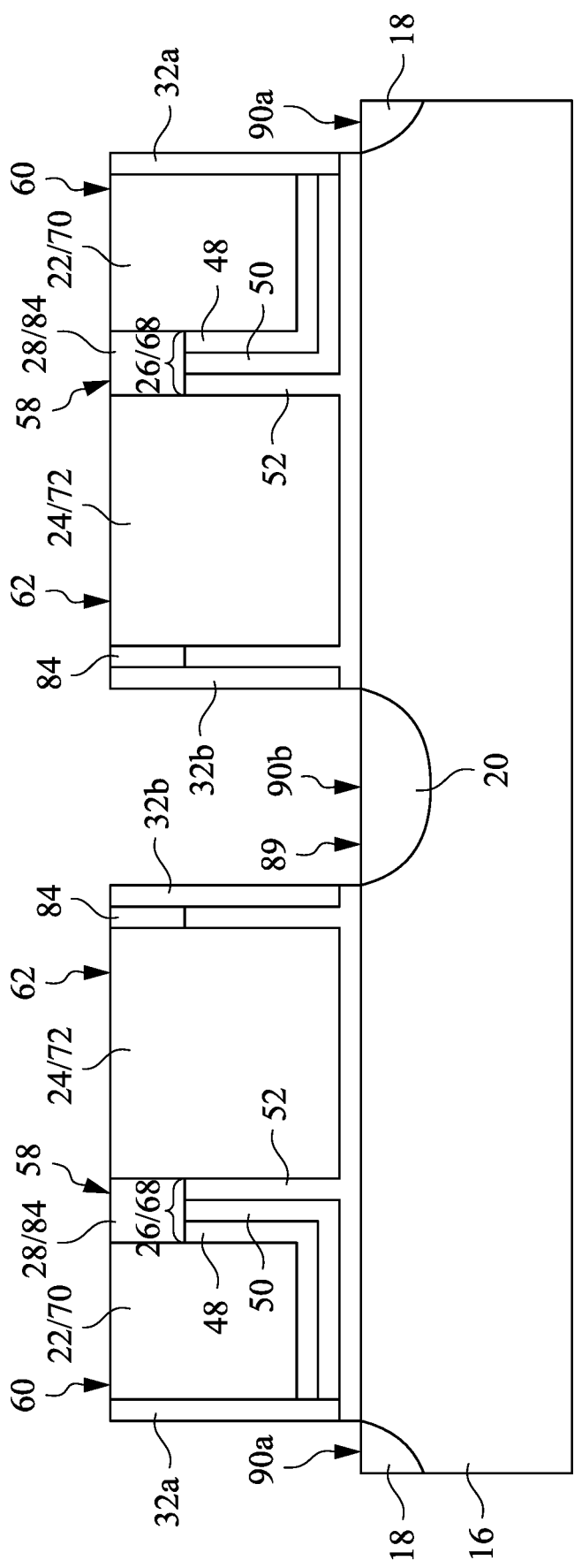

In FIG. 7, the source regions 18 and the drain region 20 are formed in the substrate 16. In one embodiment, the source regions 18 and the drain region 20 are formed subsequent to the portions of the dielectric layer 68 being removed in FIG. 6.

The source regions 18 are formed in the outer portions 90a of the upper surface 89 of the substrate 16, and the drain region 20 is formed in the inner portion 90b of the upper surface 89.

The source regions 18 and the drain region 20 may be formed using various semiconductor processing techniques. For example, the substrate 16 may be implanted with one or more dopant species, such as phosphorous, boron, etc.

In addition, in FIG. 7, the spacers 32a, 32b are formed on the substrate 16. As previously discussed with respect to FIG. 1, in one embodiment, the spacers 32a, 32b are separated from the substrate 16 by the gate dielectric layer 26. For example, as shown in FIG. 7, the spacers 32a, 32b are separated from the substrate 16 by the third layer 52 of the gate dielectric layer 26. The spacers 32a, 32b have been describe above and is not described again here.

The spacers 32a, 32b may be formed using various semiconductor processing techniques. For example, the spacers 32a, 32b may be formed using a sputtering process, a chemical vapor deposition process, or an IMP process, and then patterned using masking and etching techniques.

Additionally, in FIG. 7, upper portions of the protective layer 84 and the dielectric layer 68 are removed. In particular, referring to FIG. 6, portions of the protective layer 84 and the dielectric layer 68 (including the first layer 74, the second layer 76, and the third layer 78) that are above the memory gate 22 and the selection gate 24 are removed. As a result, as shown in FIG. 7, the upper surface 58 of the protective cap 28, the upper surface 60 of the memory gate 22, and the upper surface 62 of the selection gate 24 are exposed.

As previously discussed with respect to FIG. 1, in one embodiment, the upper surface 58 of the protective cap 28 is substantially at the same level, e.g., coplanar, with the upper surface 60 of the memory gate 22 and the upper surface 62 of the selection gate 24.

The upper portions of the protective layer 84 and the dielectric layer 68 may be removed using various semiconductor processing techniques. For example, the upper portions of the protective layer 84 and the dielectric layer 68 may be removed using masking and etching techniques, or a chemical-mechanical planarization (CMP) process.

In one embodiment, the upper portions of the protective layer 84 are removed without the use of masks. For example, in one embodiment, an etching process, such as a wet etch, is performed on the protective layer 84 until the upper portions of the protective layer 84 are removed and the protective cap 28 remains. As a result, the protective cap 28 is formed using a mask-free, two step formation process. Namely, in a first step, the protective layer 84 is formed on the upper surface 54 of the dielectric layer 68 and in the cavities 56 as discussed with respect to FIG. 4. Subsequently, in a second step, the upper portions of the protective layer 84 are removed without the use of masks as discussed above to form the protective cap 28.

It is noted that the forming of the source regions 18 and the drain region 20, the forming of the spacers 32a, 32b, and the removing of the upper portions of the protective layer 84 and the dielectric layer 68 may be performed in any order. For example, in one embodiment, the upper portions of the protective layer 84 and the dielectric layer 68 are removed first, and then the spacers 32a, 32b, the source regions 18, and the drain region 20 are formed.

Figure 8:
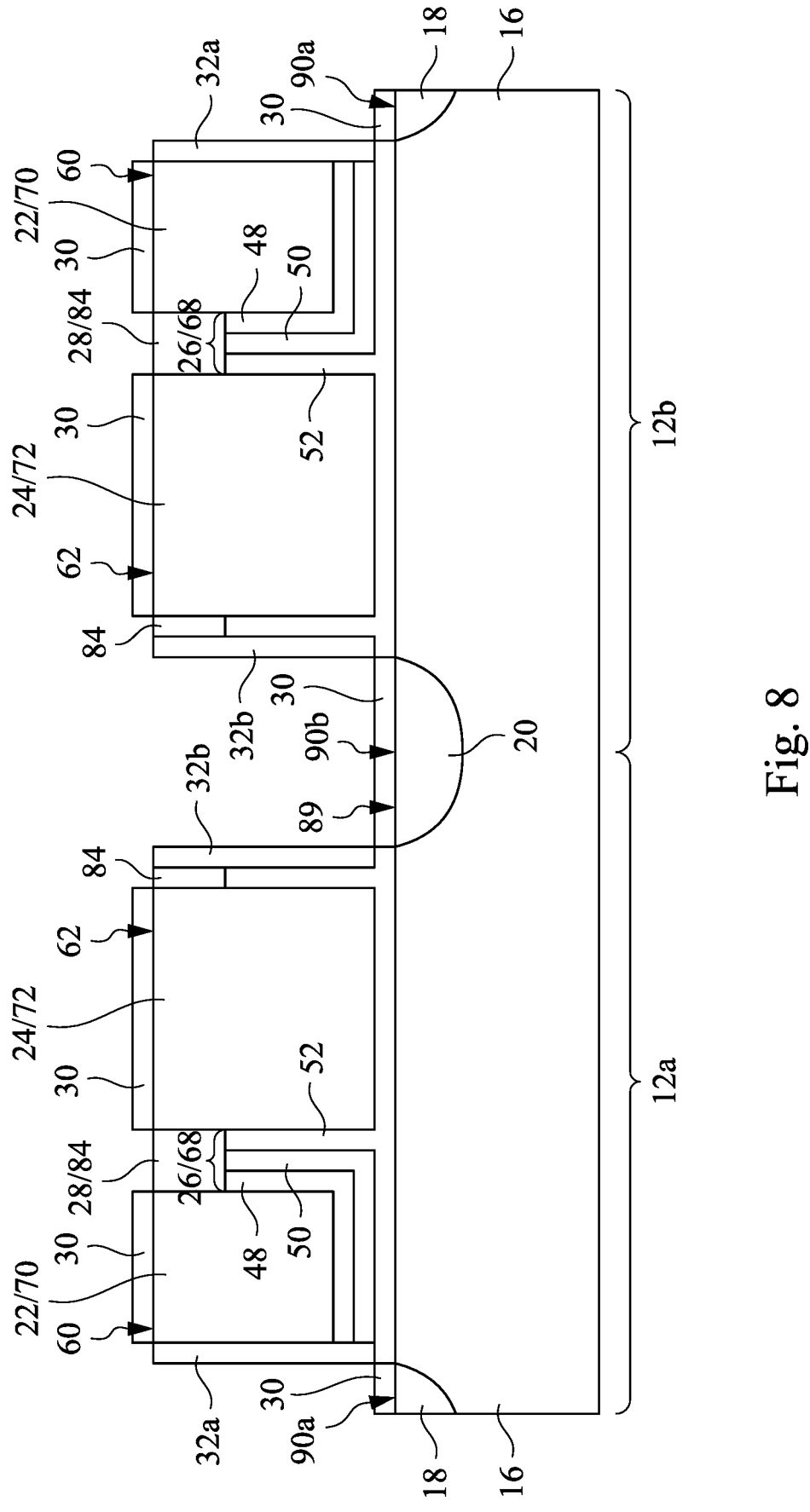

In FIG. 8, the contact layers 30 are formed on the source region 18, the drain region 20, the memory gate 22, and the selection gate 24. In one embodiment, the contact layers 30 are formed subsequent to the upper portions of the protective layer 84 and the dielectric layer 68 being removed in FIG. 7.

As previously discussed with respect to FIG. 1, in one embodiment, the contact layers 30 are used to reduce contact resistance between wiring layers (e.g., the conductive vias 36) and the source region 18, the drain region 20, the memory gate 22, and the selection gate 24.

In one embodiment, the contact layers 30 are made of a conductive material, such as nickel silicide.

The contact layers 30 may be formed using various semiconductor processing techniques. For example, the contact layers 30 may be formed using a sputtering process, a chemical vapor deposition process, or an IMP process, and then patterned using masking and etching techniques. In one embodiment, the contact layers are formed by depositing conductive material, such as a nickel, on the source region 18, the drain region 20, the memory gate 22, and the selection gate 24. Subsequently, the conductive material is annealed to form silicide layers on the source region 18, the drain region 20, the memory gate 22, and the selection gate 24. Any unreacted conductive material is then removed.

It is noted that because the protective cap 28 fills the cavity 56, the protective cap 28 prevents the conductive material used to form the contact layers 30 from being formed in the cavity 56. As a result, the memory gate 22 and the selection gate 24 are prevented from being unintentionally electrically coupled together by the conductive material. Thus, possible current leakage between the memory gate 22 and the selection gate 24 due to the presence of the conductive material in cavity 56 is minimized.

Once the contact layer 30 are formed, the ILD 34 and the conductive vias 36 are formed to create an interconnect layer, which results in the memory 10 as shown in FIG. 1. As discussed with respect to FIG. 1, The ILD 34 and the conductive vias 36 form an interconnect layer, sometimes referred to as a metal layer. The ILD 34 is formed over the first and second memory cells 12a, 12b, and electrically isolates the conductive vias 36 from each other.

The various described embodiments provide a flash memory with an improved gate structure and a method of creating the same. The flash memory includes a plurality of memory cells that include a source region, a drain region, a memory gate, a selection gate, a gate dielectric layer, a protective cap, contact layers, and spacers. The protective cap is formed on an upper surface of the gate dielectric layer. The protective cap prevents the deposition of a conductive material (which might unintentionally electrically connect the memory gate and the selection gate) onto the gate dielectric layer, and protects the gate dielectric layer from damage from subsequent fabrication processes. As a result, the improved gate structure reduces or prevents current leakage between the gates of the flash memory.

According to one embodiment disclosed herein, a nonvolatile memory includes a substrate, a first gate on the substrate, a second gate on the substrate, a gate dielectric layer between the first gate and the second gate, and a protective cap on the gate dielectric layer and between the first gate and the second gate.

According to one embodiment disclosed herein, a device includes a substrate, and a memory including a plurality of memory cells. Each of the plurality of memory cells include a source region in the substrate, a drain region in the substrate, a memory gate on the substrate and between the source region and the drain region, a selection gate on the substrate and between the source region and the drain region, a dielectric layer between the memory gate and the selection gate, and a protective cap on the dielectric layer and between the memory gate and the selection gate.

According to one embodiment disclosed herein, a method includes forming a first gate on a substrate, forming a second gate on the substrate, forming a gate dielectric layer between the first gate and the second gate, and forming a protective cap on the gate dielectric layer and between the first gate and the second gate.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a first conductive layer on a substrate;
forming a second conductive layer on the substrate;
forming a dielectric layer on the substrate, the dielectric layer including first and second portions on opposite sides of the second conductive layer, the first portion being between the first and second conductive layers;
removing a part of the first portion of the dielectric layer that separates the first and second conductive layers from each other;
removing a part of the second portion of the dielectric layer; and
forming a protective layer on the first portion of the dielectric layer at a position where the part of the first portion of the dielectric layer was removed, and on the second portion of the dielectric layer at a position where the part of the second portion of the dielectric layer was removed, such that uppermost surfaces of the first conductive layer, the second conductive layer, the protective layer over the first portion of the dielectric layer, and the protective layer over the second portion of the dielectric layer are coplanar with each other.

2. The method of claim 1 wherein forming the dielectric layer includes forming the dielectric layer between the first conductive layer and the substrate and between the second conductive layer and the substrate.

3. The method of claim 1, further comprising:
forming a source region in the substrate; and
forming a drain region in the substrate,
the first conductive layer, the second conductive layer, the dielectric layer, and the protective layer being positioned between the source region and the drain region.

4. The method of claim 1, wherein forming the dielectric layer includes forming an oxide-nitride-oxide (ONO) layer.

5. The method of claim 1, wherein forming the second conductive layer includes:

removing a first portion of the second conductive layer; and removing a second portion of the second conductive layer, the first and second portions of the second conductive layer being on opposite sides of the first conductive layer.

6. A method, comprising:

forming a first conductive layer on a substrate;

forming a second conductive layer on the substrate;

forming a dielectric layer on the substrate, the dielectric layer including a first portion between the first conductive layer and the second conductive layer, and a second portion on an opposite side of the second conductive layer from the first portion;

forming a first cavity between the first conductive layer and the second conductive layer by removing a part of the first portion of the dielectric layer between the first conductive layer and the second conductive layer;

forming a second cavity by removing a part of the second portion of the dielectric layer; and forming a protective layer on the first portion of the dielectric layer and in the first cavity, and on the second portion of the dielectric layer and in the second cavity, such that uppermost surfaces of the first conductive layer, the second conductive layer, the protective layer over the first portion of the dielectric layer, and the protective layer over the second portion of the dielectric layer are coplanar with each other.

7. The method of claim 6, further comprising:

forming source and drain regions in the substrate.

8. The method of claim 6 wherein forming the second conductive layer includes:

removing a first portion of the second conductive layer; and removing a second portion of the second conductive layer, the first and second portions of the second conductive layer being on opposite sides of the first conductive layer.

9. The method of claim 6 wherein each of the first cavity and the second cavity has a height that is between 100 and 200 angstrom, and a width that is between 100 and 200 angstrom.

10. The method of claim 6 wherein forming the dielectric layer includes forming an oxide-nitride-oxide (ONO) layer.

11. The method of claim 6, further comprising:

removing a portion of the protective layer that extends past surfaces of the first conductive layer and the second conductive layer.

12. The method of claim 11 wherein forming the protective layer and removing the portion of the protective layer is a mask-free process.

13. A method of forming a memory, the method comprising:

forming a conductive memory gate on a substrate;

forming a conductive selection gate on the substrate;

forming a gate dielectric layer having a first portion between the memory gate and the selection gate and a second portion, the first and second portions positioned on opposites sides of the selection gate;

forming a first cavity between the conductive memory gate and the conductive selection gate by removing a part of the first portion of the gate dielectric layer;

forming a second cavity by removing a part of the second portion of the gate dielectric layer;

forming a first protective cap in the first cavity, on the first portion of the gate dielectric layer, and between the conductive memory gate and the conductive selection gate;

forming a second protective cap in the second cavity and on the second portion of the gate dielectric layer; and removing portions of the first and second protective caps such that a surface of the memory gate, a surface of the selection gate, and surfaces of the first and second protective caps are at a same level with each other.

14. The method of claim 13, further comprising:

forming a source region in the substrate; and forming a drain region in the substrate, the drain region being separated from the source region by the memory gate and the selection gate.

15. The method of claim 13 wherein the forming of the gate dielectric layer includes forming a plurality of sub-layers.

16. The method of claim 15 wherein the forming of the plurality of sub-layers includes forming a first oxide layer, forming a second oxide layer, and forming a nitride layer sandwiched between the first oxide layer and the second oxide layer.

17. The method of claim 13, further comprising:

forming a first contact layer on the surface of the memory gate; and forming a second contact layer on the surface of the selection gate.

18. The method of claim 17 wherein the first contact layer and the second contact layer include nickel silicide.

19. The method of claim 13 wherein the forming of the gate dielectric layer includes forming the gate dielectric layer between the memory gate and the substrate.

20. The method of claim 19 wherein the memory gate is smaller than the selection gate.

\* \* \* \* \*